United States Patent [19]
Rosvold

[11] 3,740,619
[45] June 19, 1973

[54] SEMICONDUCTOR STRUCTURE WITH YIELDABLE BONDING PADS HAVING FLEXIBLE LINKS AND METHOD

[75] Inventor: Warren C. Rosvold, Sunnyvale, Calif.

[73] Assignee: Signetics Corporation, Sunnyvale, Calif.

[22] Filed: Jan. 3, 1972

[21] Appl. No.: 214,592

[52] U.S. Cl. ..... 317/234 R, 317/234 M, 317/234 N
[51] Int. Cl. .......... H01l 5/00
[58] Field of Search .......... 317/234, 15.3, 5.4

[56] References Cited

UNITED STATES PATENTS

| | | | |
|---|---|---|---|
| 3,623,961 | 11/1971 | van Laer | 204/15 |
| 3,639,811 | 2/1972 | Schroeder | 317/234 |
| 3,390,308 | 6/1968 | Marley | 317/100 |
| 3,519,890 | 7/1970 | Ashby | 317/101 |
| 3,459,597 | 8/1969 | Baron | 136/89 |
| 3,488,840 | 1/1970 | Hymes et al. | 29/626 |
| 3,442,701 | 5/1969 | Lepselter | 117/212 |
| 3,528,090 | 9/1970 | van Laer | 204/15 |

*Primary Examiner*—John W. Huckert
*Assistant Examiner*—E. Wojciechowicz
*Attorney*—Paul D. Flehr, Harold C. Hohbach and Aldo J. Test et al.

[57] ABSTRACT

A semiconductor structure comprising a semiconductor body having a surface with devices formed therein having portions thereof extending to the surface. A layer of insulating material is disposed on the surface. Contact means is carried by said layer and extends through said layer to make contact to said portions of said device. Bonding pads overlie the semiconductor body. Flexible links are formed as a part of the pads and secure the pads to the contact means. The bonding pads are also secured to the semiconductor body by shearable means which will permit the bonding pads to be sheared from the semiconductor body at the shearable means rather than in the semiconductor body and causing damage to the semiconductor body.

In the method, flexible links are formed as a part of the bonding pads and the bonding pads are secured to the semiconductor body by shearable means so that when external pressure is applied to the bonding pads, they will separate from the semiconductor body without causing damage to the semiconductor body.

18 Claims, 12 Drawing Figures

SEMICONDUCTOR STRUCTURE WITH YIELDABLE BONDING PADS HAVING FLEXIBLE LINKS AND METHOD

BACKGROUND OF THE INVENTION

1. Field of Invention

This invention relates to a semiconductor structure and method for making the same in which yieldable bonding pads are provided which have flexible links.

2. Description of Prior Art

In conventional semiconductor structures in which flip chip or upside down bonding is utilized, there normally are provided bumps or pillars for making interconnections between the pads on which the bumps or pillars are mounted and the lead structure extending to the outside world. In such a construction there is the necessity for stress relief to be provided between any bond which is formed and the semiconductor body. Generally, this is in the form of a solid flowable interface usually comprised of 2 or 3 microns of a very soft material such as aluminum or lead. It has been found, however, that it has been difficult to guarantee that under stress and vibration and continued flexure that these flowable interfaces will remain flowable. There has been a tendency for such flowable interfaces to work-harden which causes them eventually to crack off or to cause a break to occur in the device body itself thereby causing a massive failure. There is, therefore, a need for a new and improved construction and method which will make it possible to eliminate such failures.

SUMMARY OF THE INVENTION AND OBJECTS

The semiconductor structure consists of a semiconductor body which has a planar surface and at least one device formed in the body and having portions thereof extending to said surface. A layer of insulating material is disposed on said surface. Contact means is carried on said layer of insulating material and extends through said layer of insulating material to make contact to said portions of the device. Bonding pads overlie the semiconductor body and have flexible links secured to the contact means. Shearable means is provided for securing the bonding pads to the semiconductor body which when large forces are applied to the bonding pads will permit the bonding pads to shear at the shearable means rather than causing damage to the semiconductor body.

In the method, flexible links are formed as a part of each of the bonding pads. The bonding pads are secured to the semiconductor body so that when large external forces are supplied to the bonding pads, the bonding pads will separate from the semiconductor body without causing damage to the semiconductor body.

In general, it is an object of the present invention to provide a semiconductor structure with yieldable bonding pads having flexible links and a method for making the same.

Another object of the invention is to provide a structure of the above character in which stress relief is provided which will not fail.

Another object of the invention is to provide a structure and method of the above character which can be utilized either with thermocompression or solder reflow bonding.

Another object of the invention is to provide a structure and method of the above character which permits the use of beam lead metallurgy.

Another object of the invention is to provide a structure and method of the above character which can be used in connection with designs of existing products.

Another object of the invention is to provide a structure and method of the above character which is compatible with high speed assembly techniques.

Another object of the invention is to provide a structure and method of the above character which is compatible with existing technology.

Another object of the invention is to provide a structure and method of the above character in which the semiconductor structure can be bonded face down to a rigid body.

Another object of the invention is to provide a structure and method of the above character which eliminates several metallization operations.

Another object of the invention is to provide a structure of the above character in which improved heat radiation is obtained.

Additional objects and features of the invention will appear from the following description in which the preferred embodiments are set forth in detail in conjunction with the accompanying drawings.

DESCRIPTION OF PREFERRED EMBODIMENTS

Figures 1, 2, 3, 4, 5, 6, 7, 8, 9, 10, 11, 12:
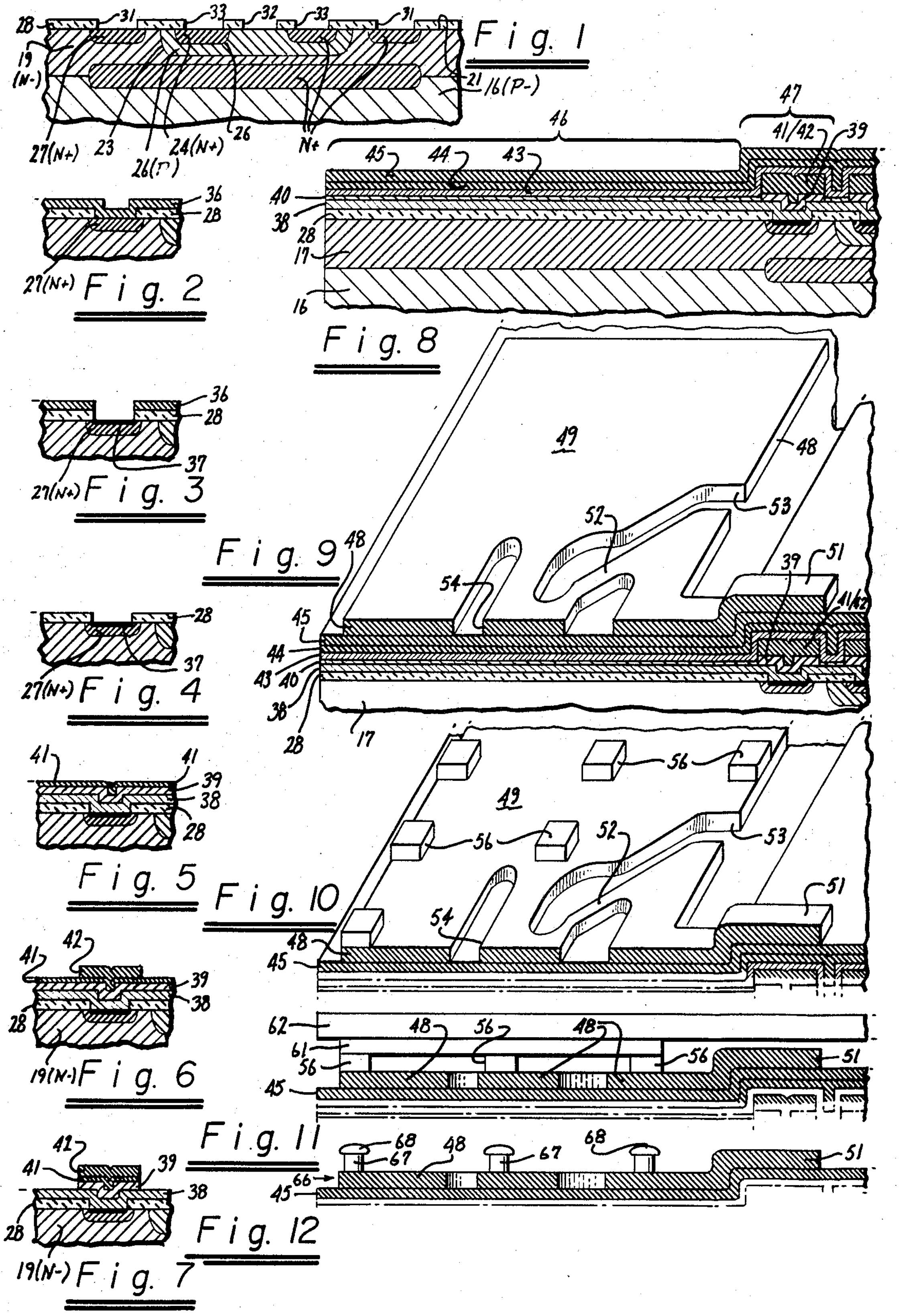
FIGS. 1 – 11 are cross-sectional views showing the steps utilized in fabricating a semiconductor structure incorporating the present invention.
FIG. 12 is a cross-sectional view showing the construction of another embodiment of a semiconductor structure incorporating the present invention.

The semiconductor structure comprising the present invention is fabricated in a conventional manner up through the structure which is shown in FIG. 1. As is well known to those skilled in the art, such a structure is formed by taking a semiconductor body 16 doped with a suitable impurity such as a P-type impurity. The body 16 is provided with a planar surface 17 and has diffused therein an N-type impurity to form a buried layer 18. Thereafter, epitaxial layer 19 is formed on the surface 17 in a conventional manner and is provided with a suitable impurity such as an N-type impurity. The epitaxial layer 19 is provided with a planar surface 21 through which there are diffused P-type regions 22 defined by dish-shaped P-N junctions 23 extending to the surface 21. N-type regions 24 are also diffused through the surface and are defined by dish-shaped P-N junctions 26 which extend to the surface 21 within the regions 23. At the same time that the regions 24 are being formed, N+ contact regions 27 are formed for collector contacts for the active devices in the form of transistors in which the region 22 serves as the base of the transistor and regions 24 serve as multiple emitters for the transistor. After the diffused regions have been formed, the silicon oxide layer which previously has been used as a mask is then generally stripped away and a new insulating layer 28 of silicon dioxide is grown on the surface 21. Thereafter, by use of suitable photolithographic techniques, windows or openings 31, 32 and 33 are formed in the insulating layer 28 with the windows 31 serving as the windows for making contact to the collector regions, the windows 32 serving to permit contact to the base regions and windows 33 serving to permit contact to the emitter regions of the active devices as shown in FIG. 1.

As soon as the semiconductor structure has reached the stage of completion shown in FIG. 1, a layer 36 of a suitable metal is deposited over the surface of the insulating layer 28 and into the windows 31, 32 and 33. The metal should be of a type which when alloyed with silicon which forms the semiconductor body forms an ohmic contact. By way of example, this can be platinum or molybdenum or many other suitable metals. Alternatively, this layer 36 can be formed of an alloy of nickel and platinum as disclosed in copending application Ser. No. 214,590, filed Jan. 3, 1972. As disclosed therein, one composition found to be particularly satisfactory consists of 88 percent nickel and 12 percent platinum.

The metal layer 36 can be deposited in any suitable manner such as by RF sputtering, DC sputtering or by thermal evaporation in a manner well known to those skilled in the art. The portions of the metal layer 36 in contact with the silicon are then alloyed with the silicon by placing the structure shown in FIG. 2 in an alloying furnace and raising the same to a suitable temperature to cause the silicon to react with all of the metal alloy within the window or opening. When the nickel platinum alloy, i.e., platinel, is utilized, this can be accomplished by raising the semiconductor structure to a temperature of approximately 450°C. The metal silicide is formed as indicated by the regions 37 in FIG. 3. The unalloyed portions of the metal layer 36 are then removed in a suitable manner such as by chemical removal to provide the structure which is shown in FIG. 4.

Metal layers 38, 39 and 41 are then deposited in situ. Thus, by way of example, the layer 38 can be formed of titanium having a thickness of approximately 1,000 Angstroms, layer 39 can be formed of platinum having a thickness of approximately 3,000 Angstroms and layer 41 can be formed of gold having a thickness of approximately 1,000 Angstroms. The bottom layer of titanium is used to promote adhesion to the alloy regions 37. The platinum layer is provided to isolate the gold from diffusing into the junction areas of the semiconductor body and the gold layer 41 is provided to form a good conductor and also to make possible easy electroforming of thicker gold interconnections as hereinafter described without depolarization and lack of adhesion.

It should be pointed out that molybdenum can be substituted for the titanium and platinum layers 38 and 39. The use of molybdenum is advantageous because it adheres well to dielectrics such as silicon dioxide and it also serves as a barrier to gold migration.

After the laminar structure consisting of the layers 38, 39 and 41 has been completed, the entire surface of the gold layer 41 is covered with a thick electroformed layer 42. As explained in copending application Ser. No. 214,589, filed Jan. 3, 1972, this is accomplished by placing the structure shown in FIG. 4 in a gold plating solution to cause the layer 42 to be formed to a suitable thickness as, for example, 3,800 to 4,200 Angstroms to provide a surface on the layer 42 which is relatively rough and to which photoresist will readily adhere. The photoresist is exposed through a desired pattern and then developed. The undesired gold is stripped chemically by the use of a suitable solution such as potassium iodide to provide the structure which is shown in FIG. 6. The portion of the platinum layer 39 which is now exposed, i.e., remaining in the field, is removed in a suitable manner such as by RF sputter etching so that there remains the titanium layer 38 in the field. As soon as the RF sputtering operation has been completed and the structure is removed from the sputtering apparatus, the titanium is exposed to the atmosphere and immediately becomes coated with a thin layer 40 of titanium dioxide because of the contact with the atmosphere.

Thereafter, as shown in FIG. 8, the exposed surface of the structure shown in FIG. 7 is coated first with a metal layer 43 of molybdenum to a suitable thickness as, for example, 1,000 Angstroms and thereafter a metal layer 44 formed of gold is also deposited to a suitable thickness such as 1,000 Angstroms. Both these layers 43 and 44 can be deposited in a conventional manner such as by RF sputtering. Thereafter, a thicker gold layer 45 ranging from 3,800 to 4,200 Angstroms is electroformed in the manner hereinbefore described. By the laminar construction herein provided, there are provided regions 46 in which there is high metal-to-dielectric adhesion and regions 47 where there is low metal-to-dielectric adhesion as shown in FIG. 8 for a purpose hereinafter described.

Photoresist is placed over the rough surface of the gold layer 45. The photoresist is then exposed in the desired pattern and developed so that the gold layer 45 is only exposed in those regions where it is desired to form additional gold. The structure is then placed in a gold plating solution for a suitable period of time as, for example, 15 minutes at a current density ranging from 3 to 8 amperes per sq. ft. to form relatively thick gold layer 48 of suitable thickness such as 60,000 Angstroms in the desired areas. Thus, as shown in FIG. 9, there are provided contact pads 49 which are secured to the semiconductor body by the laminar structure hereinbefore described. The contact pads 49 make contact to contact means 51 which includes the laminar structure extending through the windows 31, 32 and 33 by flexible links 52.

As can be seen from FIG. 9, the flexible links 52 are generally Z shaped and are formed from what would normally be a part of the pad 49. As hereinafter described because no additional area is required, it is possible to utilize the method hereinbefore described in conjunction with the geometry of existing designs because no additional space is required. Channels 53 and 54 are formed in the pad to form the Z-shaped flexible link or flexure 52. The pad itself is approximately 10 microns in thickness and this contributes to its rigidity and strength. The flexible link is also 10 microns thick and is approximately 15 microns in width. As can be seen in FIG. 8, this flexible link 52 lies in a single plane. It can have a thickness ranging from approximately 6 to 10 microns.

After the pads 49 and the contact means and the links 52 have been formed, the photoresist is removed with an appropriate organic stripper. Pillars 56 of a suitable type are then formed on the pads 49. These pillars can be formed by depositing a layer of photoresist over the pads exposing and developing the photoresist to provide the desired pattern and then electroforming the pillars to the desired height. As can be seen from FIG. 10, a plurality of pillars 56 are provided on each of the pads which are spaced more or less uniformly over the surface of the pads. The pillars are formed to a suitable height as, for example, one-half mil. When thermocompression bonding is to be utilized, the pillars can be formed of gold. The pillars are adapted to be bonded to a gold-plated Kovar lead frame or, alternatively, a gold-plated lead structure 61 which is carried by a rigid substrate 62. In making such thermocompression bonds, it is possible to utilize relatively high temperatures as, for example, 500° to 600°C for short periods of time. The use of a plurality of relatively small pillars on each of the pads 49 provides a relatively small area for making the bonds so that minimal bonding pressures on the substrate itself are required to effect the desired thermacompression bonds. This also helps to ensure that the semiconductor structure itself will not be damaged. The use of the small pillars also ensures that there will be good deformation of the pillars in case of an irregular substrate.

Operation and use of the semiconductor structure may now be briefly described as follows. Let it be assumed that an external force is applied to one or more of the bonding pads 49 by the substrate 62. Let it also be assumed that these forces are sufficiently great to cause a shearing action to take place because of the construction of the semiconductor structure, this shearing action will take place beneath the pad 49 which is secured to the semiconductor body by a low-metal-to-dielectric adhesion region 46 in the form of the relatively thin titanium dioxide layer 40 which is formed on the surface of the titanium layer 38 as hereinbefore described. It has been found that this titanium dioxide layer forms shearable means in the form of a preferential shearing region so that the molybdenum layer 43 will shear away from the titanium layer 38 in the titanium dioxide layer 40 rather than at any of the other interfaces between the layers securing the pad 49 to the semiconductor body. This preferential shearing action takes place when the titanium dioxide layer has a thickness in excess of 40 Angstroms. Such a thickness of titanium dioxide is formed almost immediately upon exposure of the titanium to the atmosphere. Further exposure to the atmosphere will increase this thickness slightly but probably not greater than to a thickness of 60 to 70 Angstroms.

Even though a pad 39 may be sheared away from the semiconductor body below it, it still remains in electrical contact with the contact means because the flexible link 52 permits movement of the pad in excess of 1 mil in both X, Y and Z directions. Thus, a pad 49 can actually lift off of the semiconductor body and still maintain good electrical contact with the contact means.

Because of these preferential shearing zones, in the event that severe external forces are applied to the pads, it can be seen that the semiconductor structure will not be destroyed and the device characteristics will not be impaired and that, in addition, good contact will continue to be maintained with the semiconductor structure.

The structure shown in FIG. 11 can be encapsulated in a suitable material. It would be preferable to utilize a plastic which is slightly flexible to permit some motion within the package itself to permit the preferential shearing action hereinbefore described to take place in the event that severe external forces are applied to the pads to prevent destruction or impairment of the semiconductor structure. Alternatively, as hereinbefore described, the bonding pads can be secured directly to a lead frame which can be encapsulated in a plastic package which is conventionally called an A-pack.

In FIG. 12, there is shown an embodiment of the invention in which solder type pillars 66 are utilized. These pillars are of a conventional type and, for example, may be comprised of a pillar portion 67 formed of approximately 8 microns of electroformed nickel which serves as a barrier to stop the migration of the solder when it is flowing. A cap portion 68 is provided on each of the pillar portions 67 and consists of gold-plated solder or tin in which there are provided approximately 3 microns of tin and approximately 1 to 2 microns of gold on the tin. Upon being heated to approximately 250°C, the tin flows into the gold creating a gold-tin eutectic system to provide the necessary bonding. The nickel of the pillar portion 67 does not wet readily and, therefore, prevents the migration of the solder into the gold and into the active regions of the device. Other types of pillars can be provided if desired.

It can be seen from the foregoing that there has been provided a semiconductor structure and method for making the same which makes it possible to overcome failures of the semiconductor structure because of external forces being applied to the bonding pads. The lead construction for the semiconductor structure is such that it incorporates the advantages of a beam lead metallurgical system while at the same time making possible a relatively simple and inexpensive structure. The semiconductor structure and method is also one which can be utilized for presently existing designs for integrated circuits. This is true because the flexible link is incorporated as a part of the bonding pad and does not require any more space than was required for the pads in the existing circuits. Thus, the flexible link provides the desired flexibility without requiring any additional space in the integrated circuit. Since the solder reflow pillars are mounted directly upon the pad, very little care must be exercised in selecting materials having dissimilar coefficients of expansion because the flexible link itself will accommodate these differential changes in expansion. This construction also permits pillars of greater height to be utilized which also minimized reflow of solder down into the semiconductor structure and the active devices therein. Thus, it can be seen that beam lead metallurgy has been combined with a solder reflow system to provide a particularly novel semiconductor structure and method for making the same.

The semiconductor structure and method is one of a type which can be readily utilized in hybrid circuitry where pillars may be bonded directly to leads carried by a ceramic substrate. The contact pads with their flexible leads will accommodate any coefficient of expansion mismatches.

Another advantage of the semiconductor structure and method is that it is possible to eliminate the glassification which is normally necessary for aluminum interconnect pillars. In addition, with the semiconductor structure, it is possible to obtain better power dissipation because the electroformed gold interconnections form better heat radiators and thus have greater ability to serve as heat sinks which overlie the junction areas.

I claim:

1. In a semiconductor structure, a semiconductor body having a surface and at least one device formed in the body having portions thereof extending to said surface, a layer of insulating material on said surface, contact means carried by said layer and extending through said layer to make contact to said portions of said device, bonding pads overlying the semiconductor body, flexible links formed of the same material as the bonding pads secured between said contact means and the bonding pads, shearable means in the form of thin layers underlying the bonding pads and securing the bonding pads to the semiconductor body but permitting a bonding pad to be preferentially sheared from the semiconductor body within the shearable means when a severe external force is applied to the bonding pad without destruction of the semiconductor body and while still maintaining good electrical contact with the device.

2. A semiconductor structure as in claim 1 wherein said flexible link is capable of flexing in at least two dimensions.

3. A semiconductor structure as in claim 2 wherein said pad and said flexible link are formed of an electroformed metal.

4. A semiconductor structure as in claim 3 wherein said electroformed metal is gold.

5. A semiconductor structure as in claim 1 together with a plurality of separate discrete pillars mounted upon each of said pads.

6. A semiconductor structure as in claim 5 wherein said pillars are formed of gold.

7. A semiconductor structure as in claim 6 wherein said pillars have a nickel pillar-like portion and a reflowable solder cap carried by the pillar-like portion.

8. A semiconductor structure as in claim 7 together with lead means bonded to said pillars.

9. A semiconductor structure as in claim 8 wherein said lead means is secured to a rigid substrate.

10. A semiconductor structure as in claim 1 wherein said contact means extending through said layer of insulating material includes layers of titanium, platinum and gold.

11. A semiconductor structure as in claim 1 wherein said thin layer is formed of a layer of an oxide of titanium having a thickness of approximately 40 Angstroms and greater.

12. A semiconductor structure as in claim 1 wherein said thin layer is formed of titanium dioxide and wherein a layer of molybdenum is disposed on one side of the layer of titanium dioxide and a layer of titanium is disposed on the other side of the layer of titanium dioxide.

13. In a method for forming a semiconductor structure, providing a semiconductor body having a surface and at least one device formed in the body and having portions thereof extending to said surface, providing a layer of insulating material on said surface, forming openings in said layer of insulating material exposing said portions extending to said surface, forming contact means on said layer of insulating material and extending through said openings to make contact with said portions, providing bonding pads overlying the semiconductor body and flexible links securing the bonding pads to the contact means, and providing shearable means underlying the bonding pads for securing the bonding pads to the semiconductor body which will shear preferentially when a severe external force is applied to the bonding pad to prevent damage to the semiconductor body while still maintaining good electrical contact with the device.

14. A method as in claim 13 together with the step of forming a plurality of separate discrete pillars in each of said pads.

15. A method as in claim 14 wherein said pillars are electroformed.

16. A method as in claim 14 together with the step of bonding lead means to said pillars.

17. A method as in claim 13 wherein said flexible links are formed from the bonding pads.

18. A method as in claim 13 wherein said shearable means is formed by exposing titanium to the atmosphere to form a thin layer of an oxide of titanium.

* * * * *